(12) United States Patent
Hohenwarter

(10) Patent No.: US 6,707,311 B2
(45) Date of Patent: Mar. 16, 2004

(54) CONTACT STRUCTURE WITH FLEXIBLE CABLE AND PROBE CONTACT ASSEMBLY USING SAME

(75) Inventor: Gert K. G. Hohenwarter, Monona, WI (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/191,166

(22) Filed: Jul. 9, 2002

(65) Prior Publication Data

US 2004/0008044 A1 Jan. 15, 2004

(51) Int. Cl.⁷ .............................................. G01R 31/02
(52) U.S. Cl. .................... 324/761; 324/754; 324/758
(58) Field of Search ................................. 324/761, 754, 324/765, 158.1, 73.1, 755, 757; 439/66

(56) References Cited

U.S. PATENT DOCUMENTS

| | | | |
|---|---|---|---|
| 5,355,079 A | | 10/1994 | Evans et al. |
| 5,416,429 A | | 5/1995 | McQuade et al. |
| 5,525,911 A | * | 6/1996 | Marumo et al. ............ 324/754 |
| 5,530,374 A | * | 6/1996 | Yamaguchi ................. 324/758 |
| 5,534,784 A | * | 7/1996 | Lum et al. .................. 324/757 |
| 5,907,245 A | | 5/1999 | Fredrickson |
| 5,982,184 A | * | 11/1999 | Hasegawa .................... 324/754 |
| 6,040,704 A | * | 3/2000 | Kondo et al. ............... 324/762 |
| 6,271,674 B1 | * | 8/2001 | Hasegawa et al. .......... 324/754 |
| 6,330,744 B1 | | 12/2001 | Doherty et al. |

* cited by examiner

Primary Examiner—Evan Pert
Assistant Examiner—Jimmy Nguyen
(74) Attorney, Agent, or Firm—Muramatsu & Associates

(57) ABSTRACT

A contact structure having contactors formed on a flexible cable to establish electrical connection with contact targets. The contact structure includes a probe card having a plurality of sockets and a plurality of contact pads and signal patterns for connecting the sockets and the contact pads, a plurality of contactors mounted on the probe card in a manner that tips of the contactors are projected from one surface of the probe card to contact with the contact targets, and a flexible cable having a plurality of signal patterns for transmitting electrical signals therethrough wherein the flexible cable has the contactors at one end while being connected to the sockets on the probe card at another end. The contactors are directly mounted on the probe card without using a space transformer.

14 Claims, 9 Drawing Sheets

Fig. 13
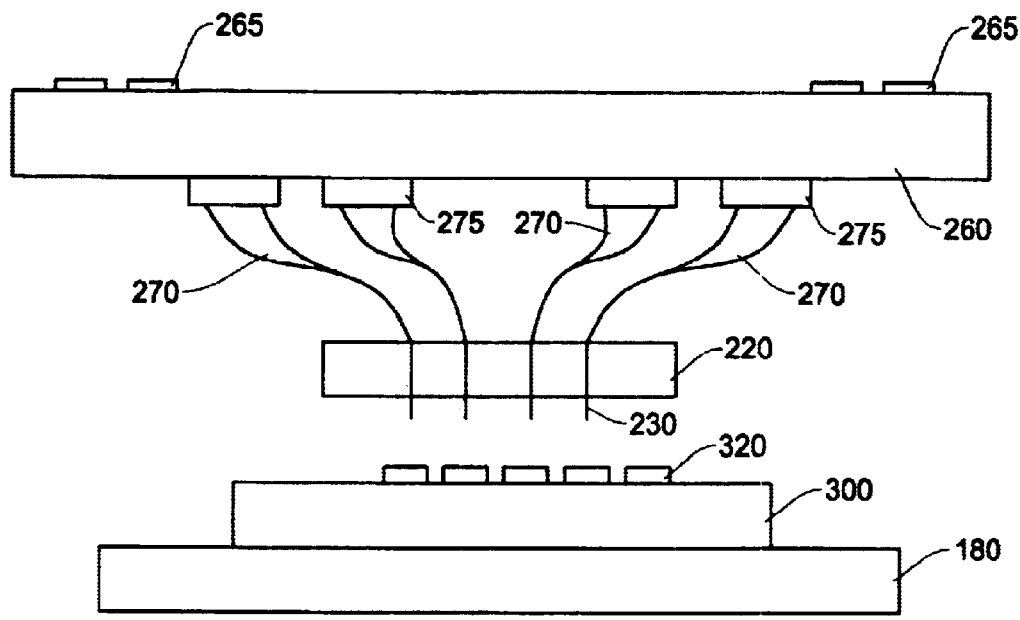
Fig. 14A  Fig. 14B  Fig. 14C  Fig. 14D
  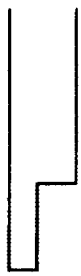 
Fig. 14E  Fig. 14F  Fig. 14G  Fig. 14H
  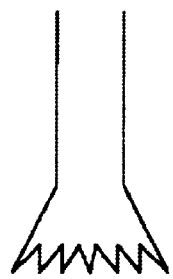 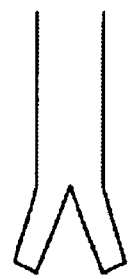

CONTACT STRUCTURE WITH FLEXIBLE CABLE AND PROBE CONTACT ASSEMBLY USING SAME

FIELD OF THE INVENTION

This invention relates to a contact structure to establish electrical connection with contact targets such as contact pads on semiconductor devices, and more particularly, to a contact structure formed with a flexible cable for use with a probe contact assembly to test semiconductor wafers, IC chips and the like, with high speed, high density and low cost.

BACKGROUND OF THE INVENTION

In testing high density and high speed electrical devices such as LSI and VLSI circuits, a high performance contact structure provided on a probe card must be used. A contact structure is basically formed of a contact substrate (space transformer) having a large number of contactors or probe elements. The contact substrate is mounted on a probe card for testing LSI and VLSI chips, semiconductor wafers, burn-in of semiconductor wafers and dice, testing and burn-in of packaged semiconductor devices, printed circuit boards and the like.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly or not.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact pads of the probe card 170 are electrically connected to the contact pins (pogo-pins) 141 provided on the frog ring 130. The contact pins 141 are also connected to the contact terminals 121 of the performance board 120 with the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

FIG. 3 is a cross sectional view showing an example of structure of a probe contact system formed with a pin block 130, a probe card 60, and a contact structure 10. Typically, the contact structure 10 is formed of a contact substrate (space transformer) 20 having a large number of contactors 30. In the example of FIG. 3, the probe contact system further includes a conductive elastomer 50 between the probe card 60 and the contact structure 10. FIG. 3 further shows a semiconductor wafer 300 having contact pads 320 thereon as contact targets. The pin block 130 and probe card 60 in FIG. 3 respectively correspond to the pogo-pin block (frog ring) 130 and probe card 170 in FIG. 2.

The pin block 130 has a large number of pogo-pins (contact pins) 141 to interface between the probe card 60 and the performance board 120 (FIG. 2). At upper ends of the pogo-pins 141, cables 124 such as coaxial cables are connected to transmit signals to printed circuit boards (pin cards) 150 in the test head 100 in FIG. 2 through the performance board 120.

The probe card 60 has a large number of contact pads (pogo-pin pads) 65 on the upper surface and contact pads 62 on the lower surfaces thereof. The contact pads 62 and 65 are connected through interconnect traces 63 to fan-out the pitch of the contact structure to match the pitch of the pogo-pins 141 on the pogo-pin block 130.

The conductive elastomer 50 is to ensure electrical communications between the electrodes 22 of the contact structure and the electrodes 62 of the probe card by compensating unevenness or vertical gaps therebetween. The conductive elastomer 50 is an elastic sheet having a large number of conductive wires in a vertical direction. For example, the conductive elastomer 50 is comprised of a silicon rubber sheet and a multiple rows of metal filaments. The metal filaments (wires) are provided in the vertical direction of FIG. 3, i.e., orthogonal to the horizontal sheet of the conductive elastomer 50.

As shown in FIG. 3, the contact structure 10 is basically formed of the contact substrate (space transformer) 20 and a plurality of contactors 30. The contact structure 10 is so positioned over the contact targets such as contact pads 320 on a semiconductor wafer 300 to be tested that the contactors 30 establish electric connections with the semiconductor wafer 300 when pressed against each other. Although only two contactors 30 are shown in FIG. 3, a large number, such as several hundreds or several thousands of contactors 30 are aligned on the contact substrate 20 in actual applications such as semiconductor wafer testing.

The contactors 30 in this example have a beam or finger like shape having a conductive layer 35 made through a semiconductor production process including, for example, photolithography and electroplating processes on a silicon substrate. The contactors 30 can be directly mounted on the contact substrate 20 as shown in FIG. 3 and to form the contact structure 10 which then can be mounted on the probe card 60 through the conductive elastomer 50. Since the contactors 30 can be fabricated in a very small size, such as 50 μm pitch, an operable frequency range of a contact structure or probe card mounting the contactors 30 can be in the range of 2 GHz or higher.

An interconnect trace 24 is connected to the conductive layer 35 at the bottom of the contact substrate (space transformer) 20. The contact substrate 20 further includes a via hole 23 and an electrode 22. The electrode 22 is to interconnect the contact substrate 20 to an external structure such as the contact pads 62 and 65 of the probe card 60 through the conductive elastomer. Thus, when the semiconductor wafer 300 moves upward, the silicon finger contactors 30 and the contact targets 320 on the wafer 300 mechanically and electrically contact with each other. Consequently, a signal path is established from the contact target 320 to a test head of the semiconductor test system through the electrodes 22 on the contact substrate 20, conductive elastomer 50, probe card 60 and pin block 130.

FIG. 4 is a cross sectional view of another example of contact assembly. The contact substrate (space transformer) 20 having a plurality of contactors 30 is mounted on the probe card 60 through a support frame 55 and a conductive elastomer 50. The support frame 55 for supporting the contact substrate 20 is connected to the probe card 60 by fastening means such as screws 150 and 152. As noted above, the conductive elastomer 50 establishes electrical conductivity only in the vertical direction, i.e., between the contact substrate 20 and the probe card 60. The probe card 60 has contact pads 65 for electrical connection with pogo-pins 141 when fully assembled.

In the foregoing conventional example, a large number of contactors must be used in the semiconductor wafer test, such as from several hundreds to several thousands. Because such a large number of contactors are needed in the contact structure, the resultant contact structure involves high production cost. Since the semiconductor industry is under the continued demands of improving performance per cost, it is also necessary to decrease the test cost using the semiconductor test system. Under the circumstances, there is a need in the industry to incorporate a more simple and economical way to form the contact structure for testing a semiconductor wafer or IC chips.

SUMMARY OF THE INVENTION

Therefore, it is an object of the present invention to provide a contact structure and a probe contact assembly to establish electrical contact with contact targets with low cost and high performance.

It is another object of the present invention to provide a contact structure and a probe contact assembly having a flexible cable and contactors formed at one end of the flexible cable for establishing electrical communication with contact targets with high frequency range, density and and low cost.

It is a further object of the present invention to provide a contact structure and a probe contact assembly using a flexible cable for establishing signal paths between contactors and contact pads on a probe card to eliminate a space transformer or fine patterns on the space transformer thereby reducing the cost of the probe contact assembly.

In the present invention, the contact structure includes a probe card having a plurality of sockets and a plurality of contact pads and signal patterns for connecting the sockets and the contact pads, a plurality of contactors mounted on the probe card in a manner that tips of the contactors are projected from one surface of the probe card to contact with the contact targets, and a flexible cable having a plurality of signal patterns for transmitting electrical signals therethrough wherein the flexible cable has the contactors at one end while being connected to the sockets on the probe card at another end.

The contactors are integrally formed at the end of the flexible cable using conductor of the signal patterns on the flexible cable. Alternatively, the contactors are produced separately from the flexible cable and attached to the corresponding signal patterns on the flexible cable. The flexible cable having the contactors are provided on one surface of the probe card and the tips of the contactors are inserted in the probe card and projected from another surface of the probe card. Preferably, the flexible cable having the contactors is clamped by an alignment frame and attached to the probe card after inserting the contactors in the probe card.

In a further aspect, the contact structure of the present invention includes a probe card having a plurality of sockets and a plurality of contact pads and signal patterns for connecting the sockets and the contact pads, a support substrate provided in parallel with the probe card for mounting contactors for connecting the contactors with the contact targets, a plurality of contactors mounted on the support substrate in a manner that tips of the contactors are projected from one surface of the support substrate to contact with the contact targets, and a flexible cable having a plurality of signal patterns for transmitting electrical signals therethrough wherein the flexible cable has the contactors at one end while being connected to the sockets on the probe card at another end.

Further aspect of the present invention is a probe contact assembly for interfacing between semiconductor device under test and a semiconductor test system. The probe contact assembly includes the contact structure noted above in addition to a plurality of flexible contact pins for connecting the contact pads on the probe card with the semiconductor test system thereby sending test signals to the semiconductor device under test.

According to the present invention, the contact structure is created with use of flexible flat cables which are available in the market. The contactors are formed at one end of the flexible cable and are mounted on a probe card or support substrate. The contact structure of the present invention is low cost, reliable and yet achieves high performance. Since the flat cables connecting the contactors and the pads on the probe card enable to obviate either a space transformer (contact substrate) or fine pitch wiring patterns on the contact substrate in the conventional technology, the present invention also contributes to the overall cost reduction and design simplification in the probe contact assembly.

BRIEF DESCRIPTION OF THE DRAWINGS

FIG. 13 is a schematic diagram showing another example of contact structure of the present invention having a support substrate for supporting the contactors formed at the end of the flexible cable.

FIGS. 14A–14H are schematic diagrams showing various examples of shape of the contactors formed at the end of the flexible cable in the present invention.

DETAILED DESCRIPTION OF THE PREFERRED EMBODIMENT

An example of contact structure and a probe contact assembly using such a contact structure in the present invention will be described with reference to FIGS. 5–14. Although the present invention will be described for the case of testing a semiconductor wafer, the contact structure of the present invention can also be used in testing LSI and VLSI chips, printed circuit boards and the like, and burn-in of semiconductor wafers and chips.

Figure 1:
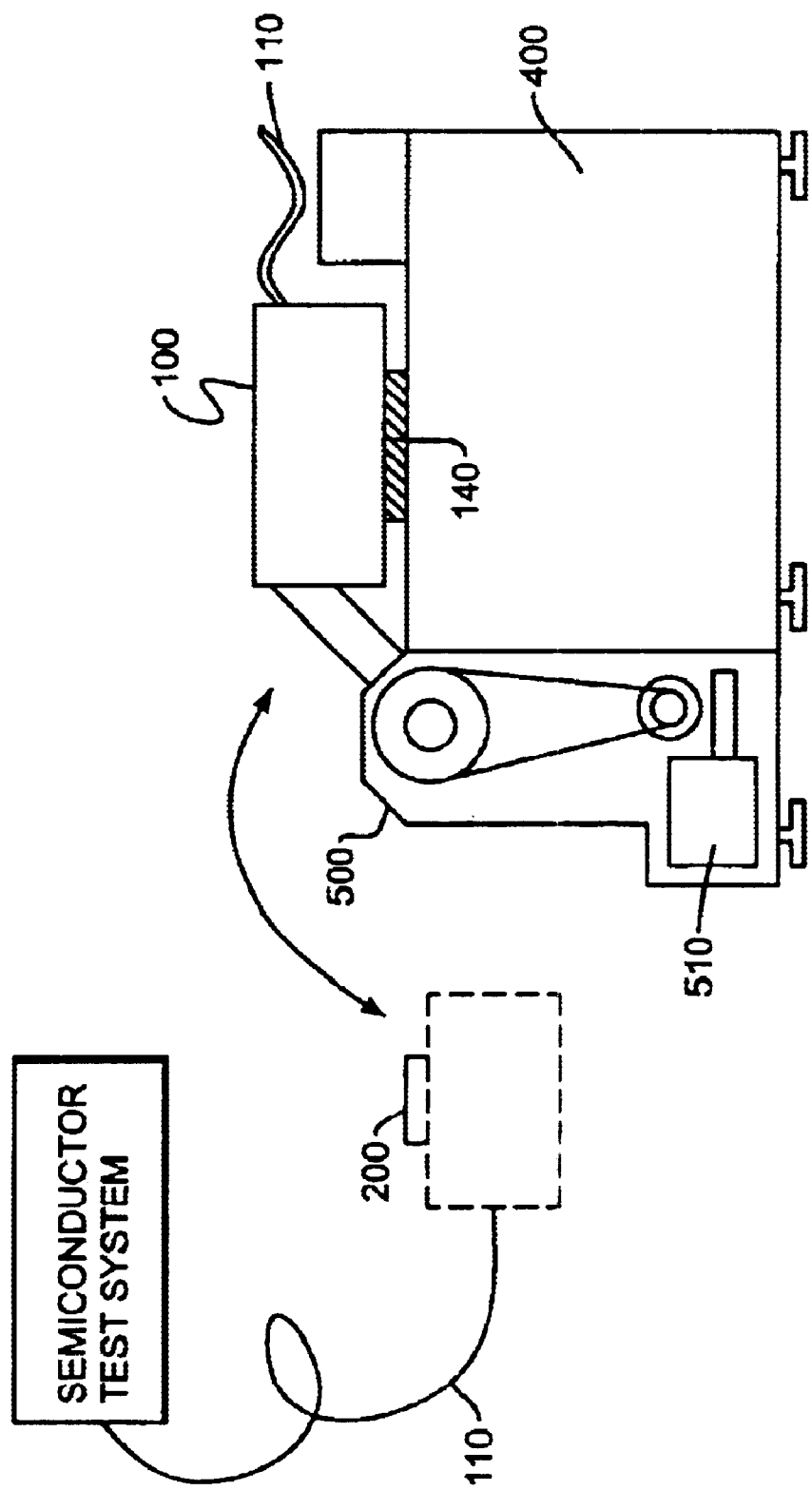
FIG. 1 is a schematic diagram showing a structural relationship between a substrate handler and a semiconductor test system having a test head.
Figure 2:
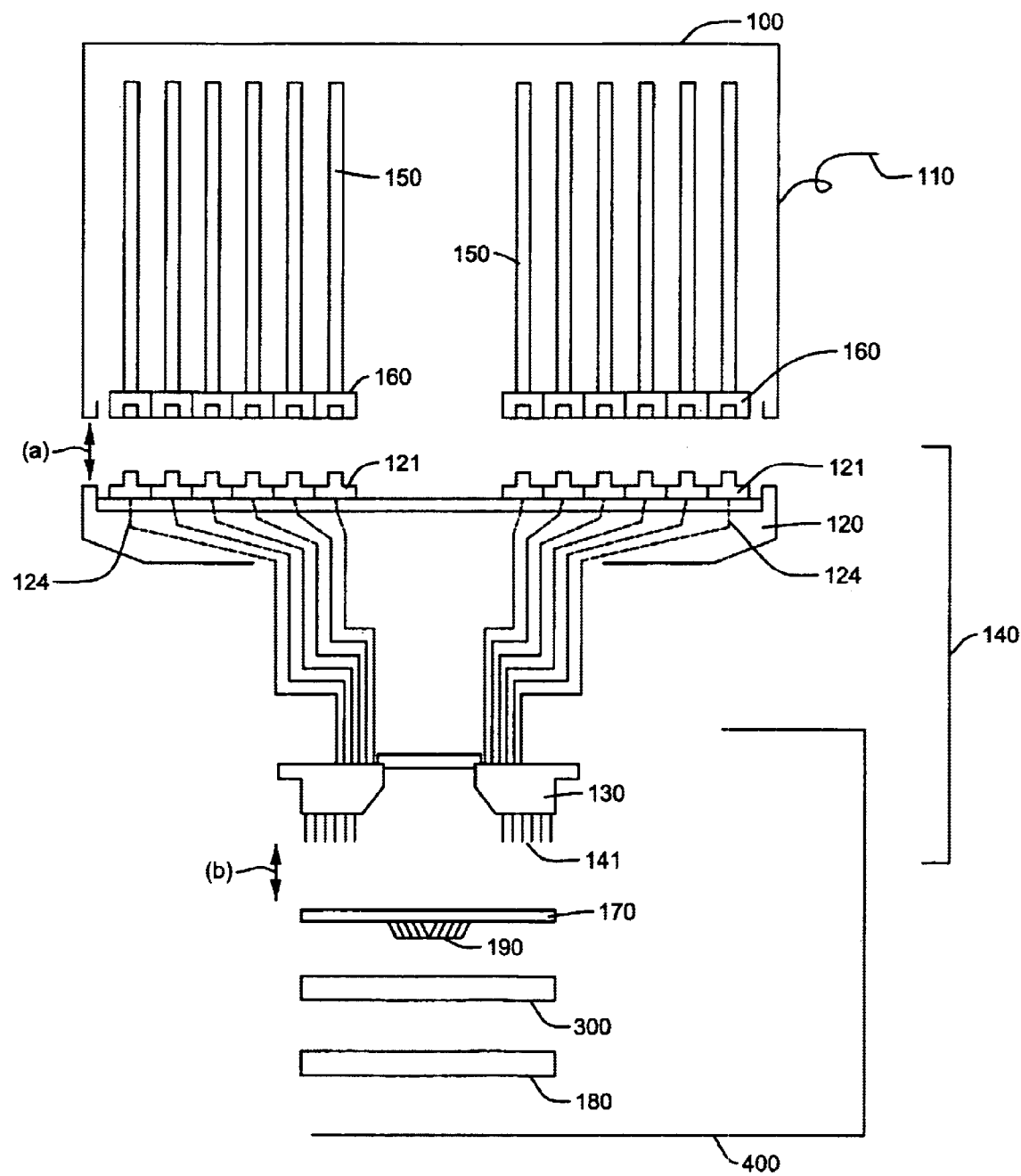
FIG. 2 is a diagram showing an example of detailed structure for connecting the test head of the semiconductor test system to the substrate handler.
Figure 3:
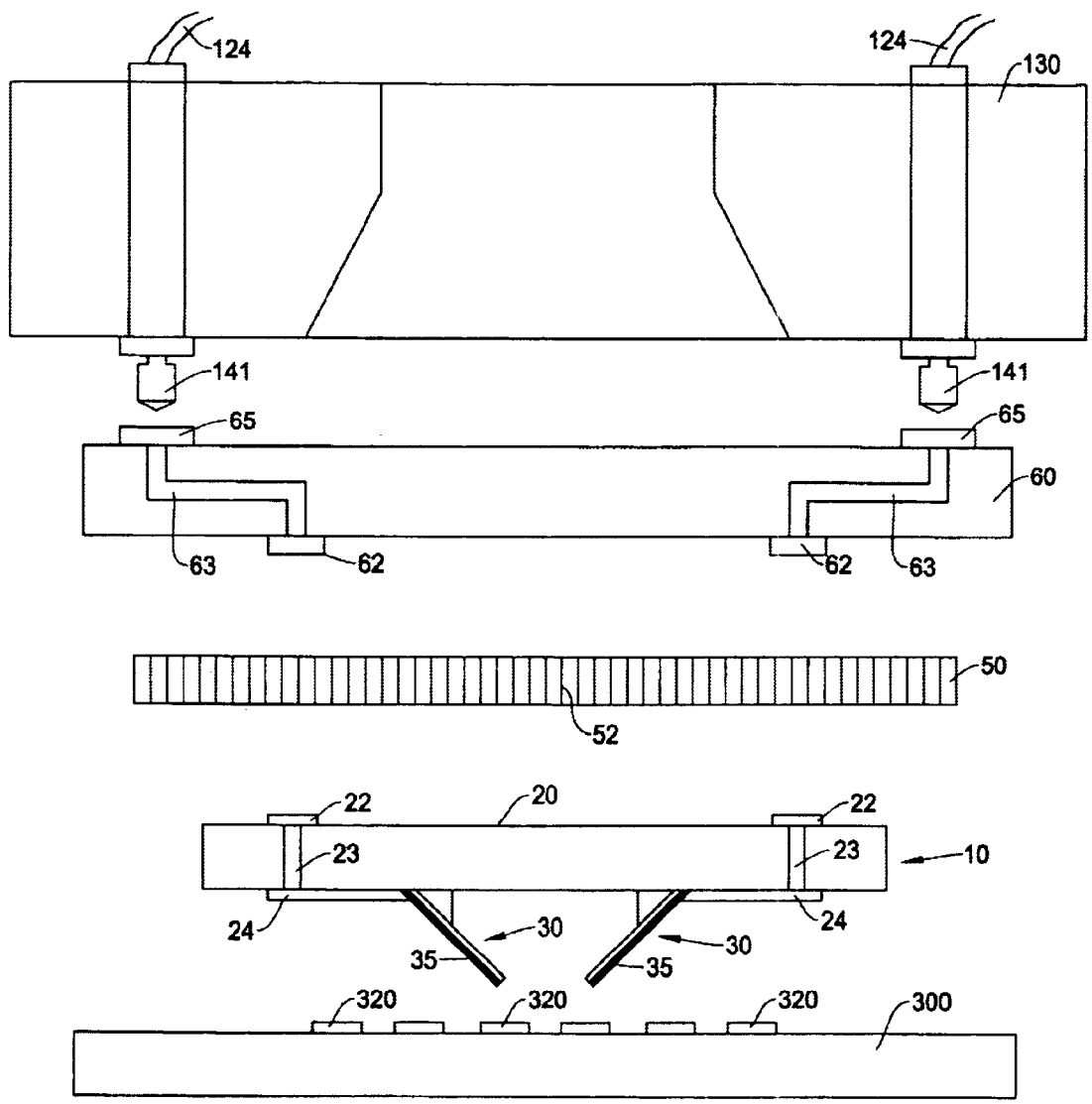
FIG. 3 is a schematic diagram showing a cross sectional view of an example of a probe contact system using the conventional contact structure for interfacing between the semiconductor device under test and the test head of the semiconductor test system.
Figure 4:
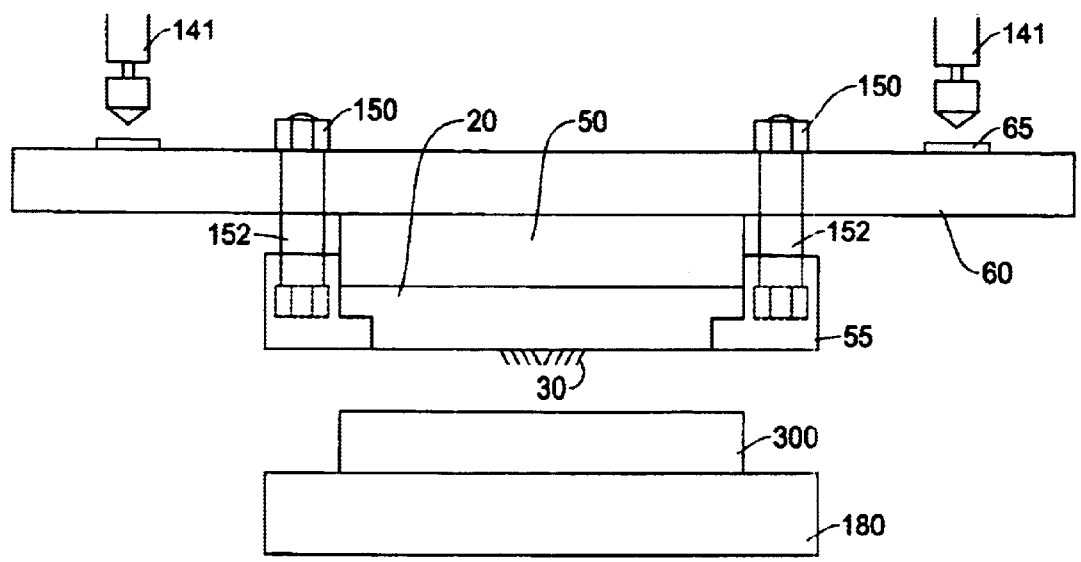
FIG. 4 is a schematic diagram showing a cross sectional view of another example of a probe contact system using the conventional contact structure for interfacing between the semiconductor device under test and the test head of the semiconductor test system.
Figure 5:
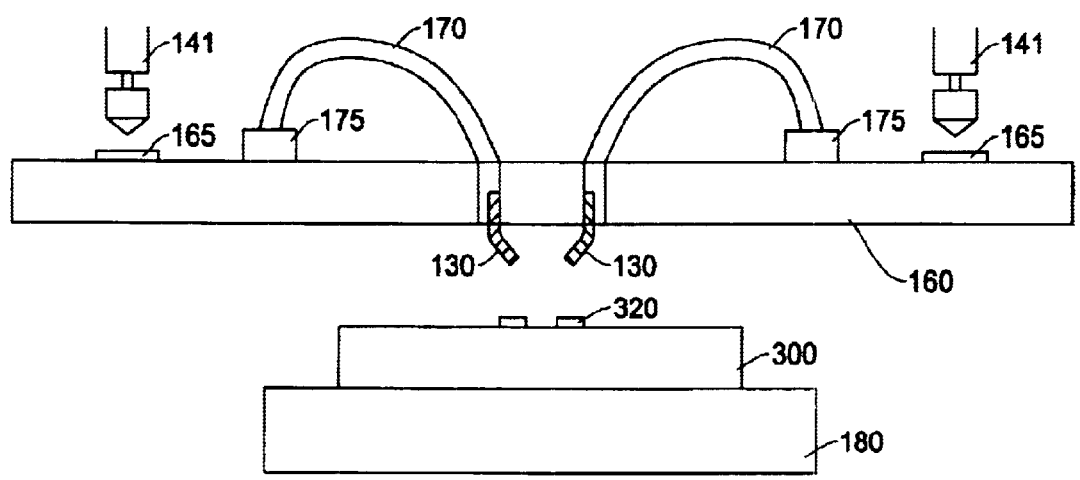
FIG. 5 is a schematic diagram showing a cross sectional view of a probe contact assembly using the contact structure of the present invention for interfacing between the semiconductor device under test and the test head of the semiconductor test system.

FIG. 5 is a cross sectional view of the contact structure of the present invention. The essential feature of the present invention is to use a flexible flat cable commonly available in the market for forming contactors at the end thereof. In the example of FIG. 5, the contact structure is created by a flexible cable 170, contactors 130 formed at the end of the flexible cable 170 and a probe card 160. Contact pads (pogo-pin lands) 165 are provided on the probe card 160 to connect with the pogo-pins 141. Thus, the contact structure of FIG. 5 is equivalent to the probe contact assembly of FIGS. 3 and 4. It should be noted that, in this example of FIG. 5, the contact substrate (space transformer) 20 shown in the conventional examples of FIGS. 3 and 4 is not used.

Figure 7:
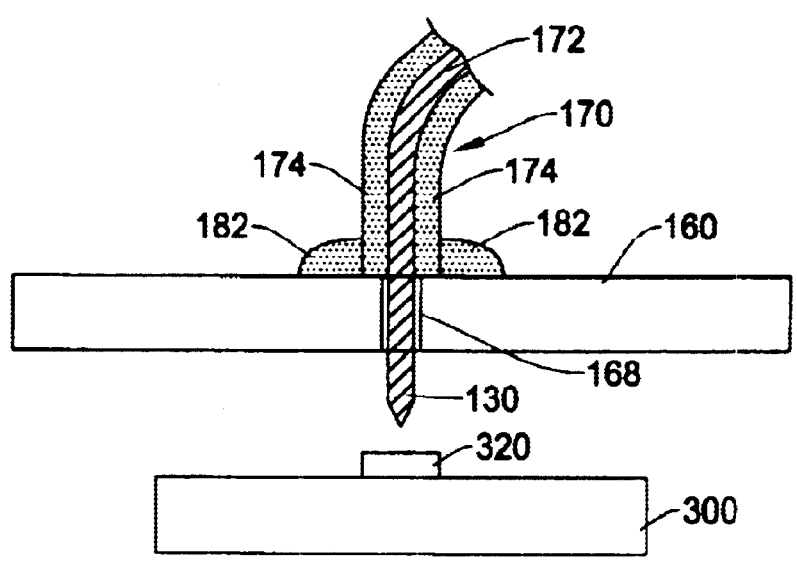
FIG. 7 is a diagram showing a cross sectional view of the flexible cable and a contactor formed at an end of the flexible cable in the contact structure of the present invention.
Figure 8:
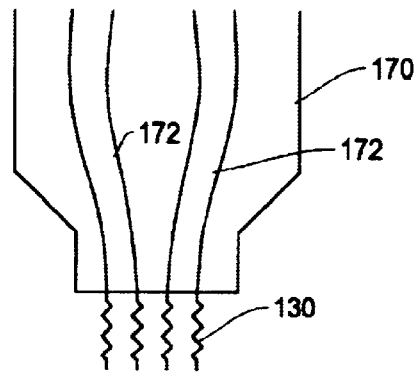
FIG. 8 is a schematic diagram showing a front view of the flexible cable and the contactor formed at the end of the flexible cable in the present invention.
Figure 9:
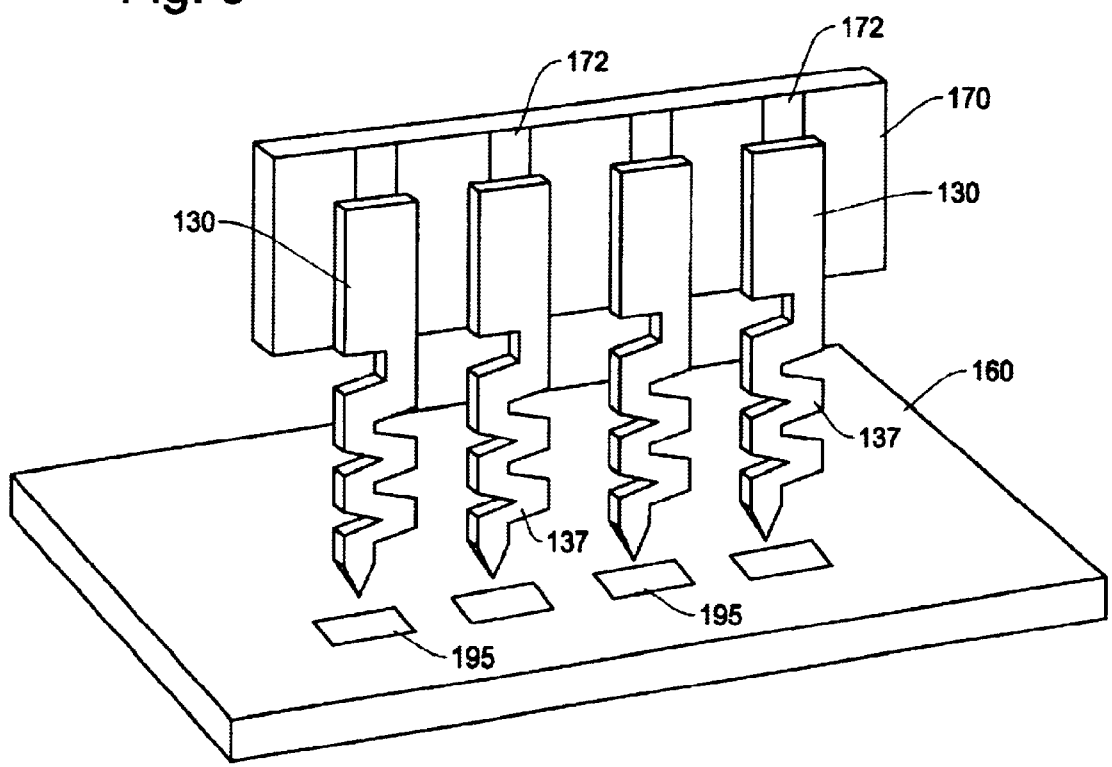
FIG. 9 is a perspective view showing an example of detailed structure of the contactors formed on the flexible cable and the probe card in the present invention.

The flexible cable 170 is a flat and flexible cable (flexible wiring board) typically made of polyimide, polyester or epoxy woven fiberglass such as shown in FIGS. 8 and 9. The flexible cable is either single-sided or double-sided and typically covered by an insulation layer. The flexible cable has a plurality of signal lines 172 (FIG. 7) made of conductive material such as nickel, copper or gold on the surface thereof or between two polyimide layers.

The contactors 130 are created by using the signal lines 172 of the flexible cable or attaching the separately made contactors to the signal lines 172 on the flexible cable 170. The contactors 130 are inserted in the probe card 160 so that substantial portions of the contactors are projected from the bottom surface of the probe card 160. The other end of the flexible cable 170 has a connector which is connected to the probe card 160 through a socket 175 formed on the probe card 160.

Although not shown in FIG. 5, signal patterns are formed on the probe card 160 to connect the sockets 175 and the contact pads 165 so as to establish a signal path between a tip of the contactor 130 and the pogo-pin 141. In an example of semiconductor wafer testing, several hundreds or several thousands of contactors are mounted on the probe contact assembly. Therefore, a large number of such signal patterns are formed on the probe card 160.

In the conventional technology, fine pitch wiring patterns have to be formed on the contact substrate (space transformer) 20 shown in FIGS. 3 and 4 to fan-out the small pitch of contactors to the pitches on the probe card. In the present invention, because of the flexible cables 170, the contact substrate (space transformer) is no longer used or such fine patterns can be obviated from the contact substrate. This significantly contributes to the reduction of overall cost of the probe contact assembly.

Figure 6:
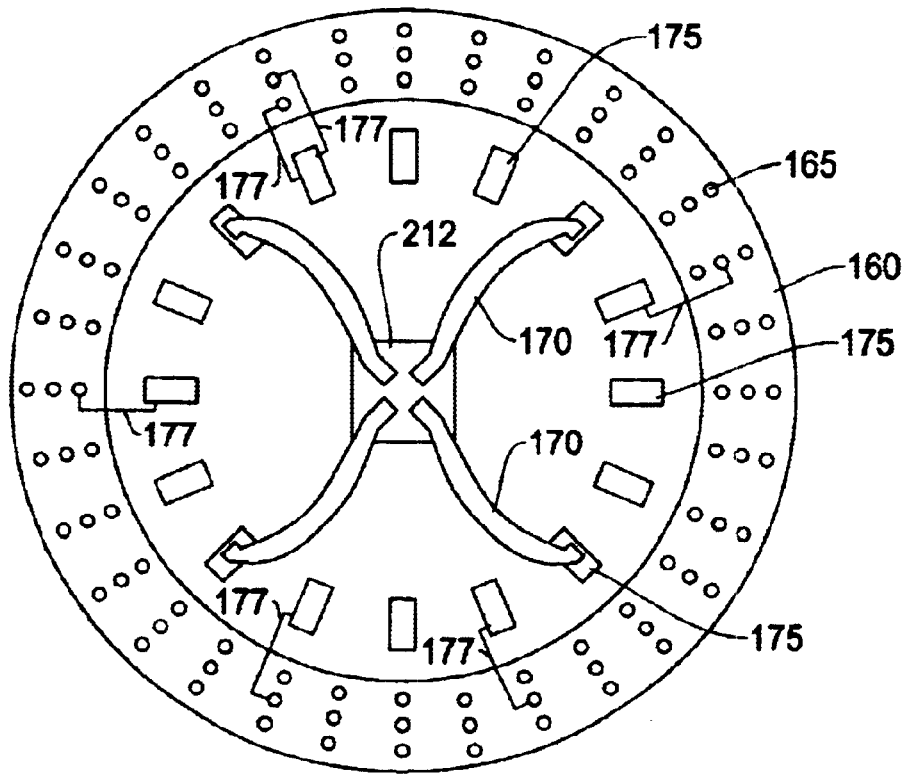
FIG. 6 is a schematic diagram showing a top view of the probe contact assembly of the present invention of FIG. 5 without showing the flexible cables.

FIG. 6 is a top view of the contact structure of the present invention showing the probe card 160 and the flexible cable 170. At the center of the probe card 160, a contact area 212 is defined in which the contactors 130 (not shown) formed at the end of the flexible cable 170 are inserted to be projected from the bottom surface of the probe card 160. The contact pads 165 are radially aligned on the probe card as many as several hundreds or several thousands each contacting with the pogo-pin 141 of FIG. 5 when assembled. Signal patterns 177 are formed on the probe card 160 to connect the sockets 175 and the contact pads 165.

FIG. 7 is a cross sectional view showing an example of structure of the contactor and the flexible cable in more detail. In this example, the flexible cable 170 has a signal line (conductor) 172 which is formed within flexible insulation layers (films) 174 made of polyimide, polyester or epoxy woven fiberglass, or the like. At the end, the insulation layers 174 are removed and the conductor 172 forming the contactor 130 is inserted in a through hole 168 formed on the probe card 160. Such a through hole on the probe card can be created through, for example, deep reactive ion etching.

An adhesive 182 is preferably provided to fixedly connect the flexible cable 170 on the probe card 160. The flexible cable 170 can be attached to the probe card 160 by other means such as using an alignment frame of FIGS. 11 and 12. It should be noted that the sizes of the components in FIG. 7 are exaggerated to clearly describe the structure. For example, in reality, relative thickness of the flexible cable 170 is much smaller than the thickness of the probe card 160.

An example of front view of the flexible cable 170 is shown in a schematic diagram of FIG. 8 wherein a large number of conductor (signal lines) 172 are formed on a flat surface of the cable 170 with a fine pitch such as several ten to several hundred micrometers. Each contactor 30 is connected to the corresponding signal line 172 at the end of the flexible cable 170. Preferably, the contactor 30 has a spring portion 137 (FIG. 9) to produce a resilient contact force when pressed against the contact target.

FIG. 9 is a perspective view showing an example of detailed structure of the contactors 130 formed on the flexible cable 170 to be mounted on the probe card 160. In this example, the contactors 130 are produced separately and attached to the conductor 172 on the flexible cable to be inserted in through holes 195 on the probe card 160. Each contactor 130 is flat as a whole and has a spring portion 137 which is zig-zag shaped or multiple bent to produce a spring force in a vertical direction of FIG. 9 when pressed against the contact target.

The contactors 130 can be produced through various methods, one example of which is disclosed in the U.S. Pat. Nos. 5,989,994 and 6,297,164 owned by the same assignee of the present invention. These patents provide an easy and reliable process for producing a large number of contactors of complicated shape at the same time with low cost. Basically, the contactors 130 are produced in a horizontal direction on a planar surface of a substrate such as a silicon substrate and removed from the silicon substrate to be attached to the flexible cable 170.

The contactors 130 are connected to the corresponding conductor 172 by means of, for example, conductive adhesive, solder reflow, or other means. When the contactors 130 are inserted in the through holes 195, the flexible cable 170 is preferably fixed to the probe card through an adhesive or other means. Although not shown, at the end of the flexible cable 170, where the contactors 130 are connected, an enforcing means such as a rigid plate may be provided to improve the mechanical strength of this area.

Figure 10:
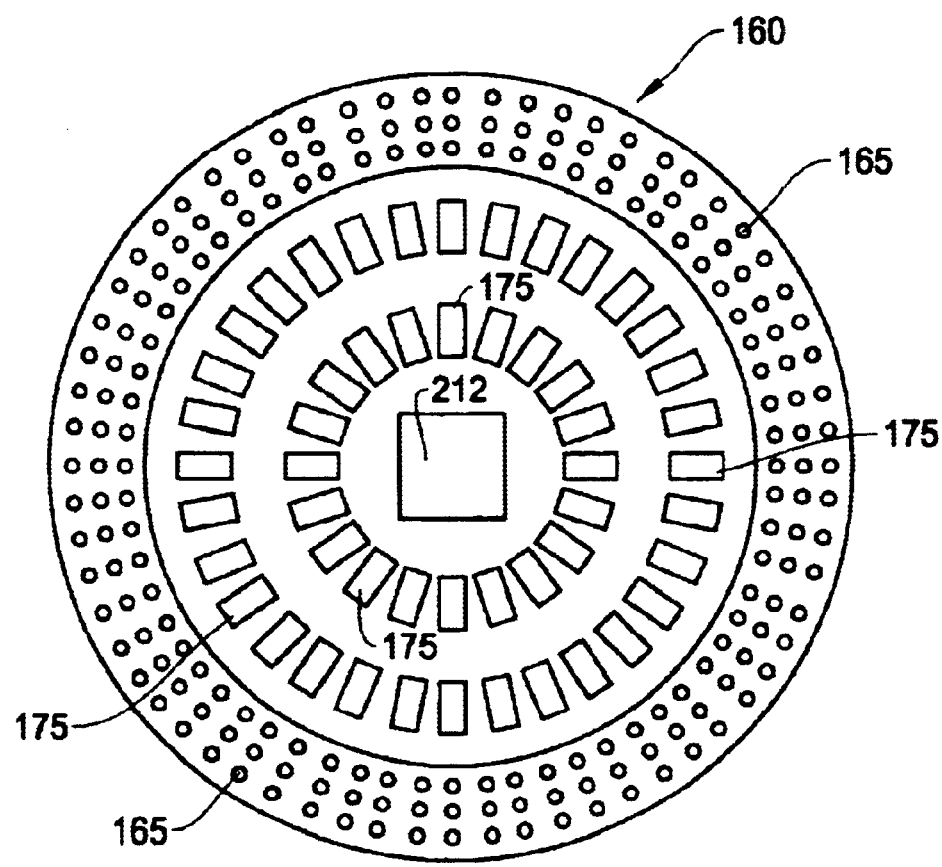
FIG. 10 is a schematic diagram showing an example of top view of the probe card for forming the contact structure of the present invention.

FIG. 10 is a schematic diagram showing an example of top view of the probe card for forming the contact structure of the present invention. This is basically the same structure as shown in FIG. 6 although the flexible cables are not shown here. A large number of the contact pads (pogo-pin lands) 165 and the sockets 175 are radially aligned to accommodate a large number of pins of a semiconductor device to be tested. The contact area 211 is formed at the center of the probe card to mount the flexible cables 170 in a manner that the contactors are projected from the bottom surface of the probe card as shown in FIGS. 5 and 7.

Figure 11:
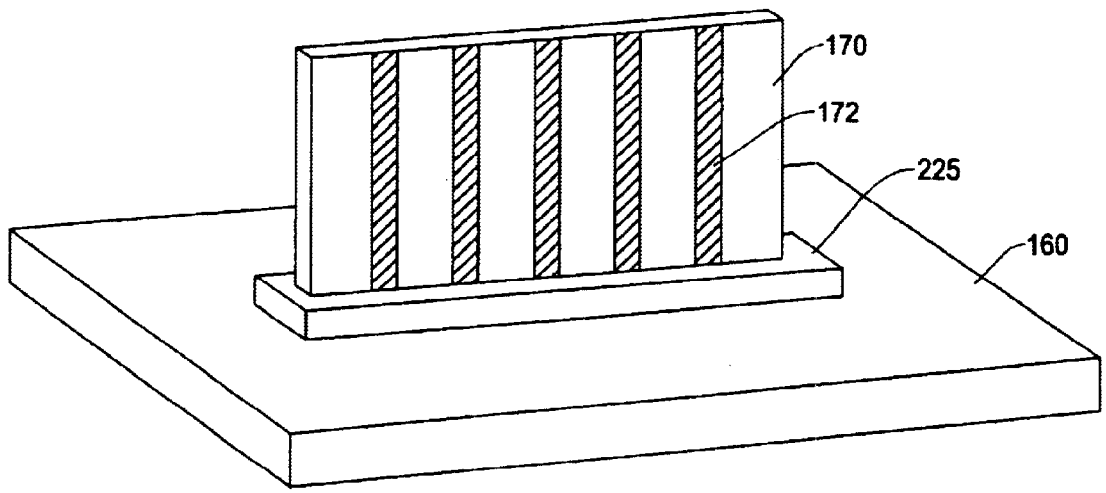
FIG. 11 is a perspective view showing another example of contact structure of the present invention using the flexible cable.
Figure 12:
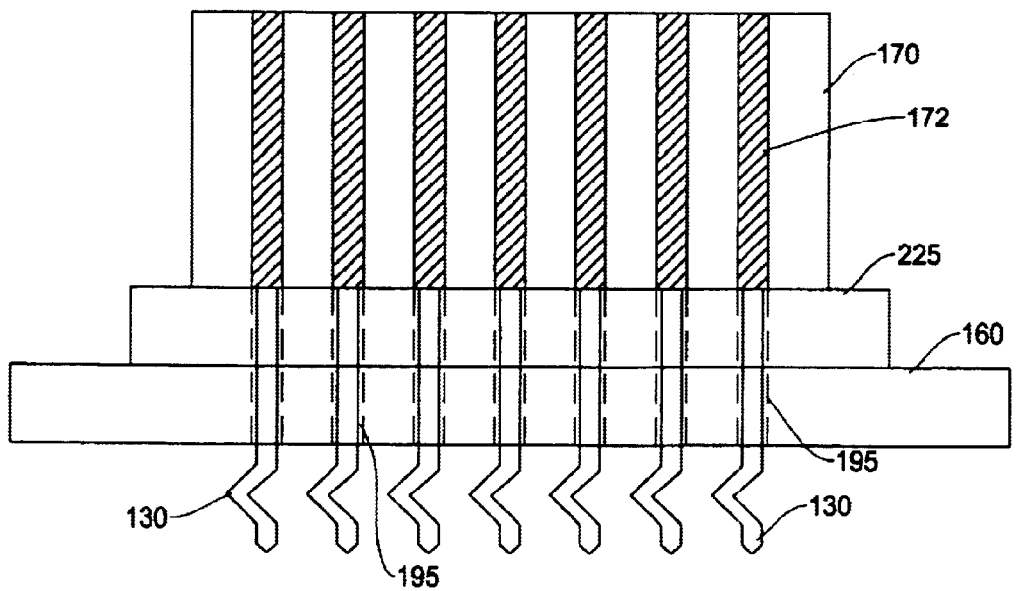
FIG. 12 is a cross sectional view showing the contact structure of FIG. 11 of the present invention having the contactors formed on the flexible cable.

FIG. 11 is a perspective view showing another example of contact structure of the present invention using the flexible cable. FIG. 12 shows a cross sectional view of the contact structure of FIG. 11. In this example, the flexible cable 170 is attached to the probe card 160 through an alignment frame 225. Another end of the flexible cable 170 is not shown here for simplicity. Contactors 130 are connected to the corresponding signal lines 172 on the flexible cable 170 (FIG. 12).

The alignment frame 225 is, for example, a plastic frame for clamping the end of the flexible cable 170 at the connection points with the contactors 130 to align the contactors as well as to provide rigidity to the flexible cable 170. After mounting the flexible cable 170 in a manner that the contactors 130 project from the bottom surface of the probe card 160, the alignment frame 225 is attached to the probe card 160 through fastening means such as screws or adhesives. The contactor 130 has a spring (ex. bent or curve) to exert a resilient contact force when the tip thereof is pressed against the contact target.

FIG. 13 is a schematic diagram showing another example of contact structure of the present invention having a support substrate for supporting the contactors formed at the end of the flexible cable. This example shows a case where flexible cables are mounted at the lower side of the probe card and contactors at the end of the flexible cable are mounted on a support substrate (contact substrate). FIG. 13 also shows a semiconductor wafer or an IC device under test having contact pads.

Namely, in the example of FIG. 13, a support substrate 220 is provided at the bottom of a probe card 260 through a fixing means (not shown) such as support frame and fastening screws shown in FIG. 4. The flexible cables 270 are connected to the probe card at the bottom surface thereof 260 through sockets 275. At the other ends of the flexible cables 270, contactors 230 are formed and mounted on the support substrate 220 in a manner that the tips of the contactors 230 project from the bottom surface of the support substrate 220.

Since the flexible cables 270 directly connect the contactors to the probe card, the fine wiring patterns required on the contact substrate (space transformer) 20 in the conventional example need not be formed on the support substrate 220. The design of the support substrate is greatly simplified and the cost of which is greatly reduced. The semiconductor wafer 300 having contact pads 320 is mounted on a chuck of a wafer prober. Thus, when the contact structure and the semiconductor wafer are pressed against each other, the electrical communication will be established between the contact structure and the semiconductor wafer 300, thereby enabling to test the semiconductor wafer by the semiconductor test system.

FIGS. 14A–14H are schematic diagrams showing various examples of shape of the contactors formed at the end of the flexible cable in the present invention. The contactors are formed at the ends of the flexible cable by using the conductor running on the flexible cable itself or attaching the separately made contactors to the flexible cable. As noted above, an example of procedures for producing the contactors is to form the contactors flatly on a planar surface of the substrate in the horizontal direction and remove therefrom to mount the contactors on the contact structure in the vertical direction.

Preferably, the tip of the contactor is sharpened to achieve a scrubbing effect for high contact performance. When the contactor tip is sharpened, and when pressed against the contact target, the contactor tip scrubs an oxide surface of the contact target, thereby directly contacting the conductive material of the contact target. Thus, most of the examples of FIGS. 14A–14H have a sharped end to improve the contact performance through such a scrubbing effect. Further, the contactors have zig-zag shaped, curved, or inclined portions to function as a spring to produce the resilient contact force.

As has been foregoing, according to the present invention, the contact structure is created with use of flexible flat cables which are available in the market. The contactors are formed at one end of the flexible cable and are mounted on a probe card or support substrate. The contact structure of the present invention is low cost, reliable and yet achieves high performance. Since the flat cables connecting the contactors and the pads on the probe card enable to obviate either a space transformer (contact substrate) or fine pitch wiring patterns on the contact substrate in the conventional technology, the present invention also contributes to the overall cost reduction and design simplification in the probe contact assembly.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing electrical connection with contact targets, comprising:
   a probe card having a plurality of sockets and a plurality of contact pads and signal patterns for connecting the sockets and the contact pads where said contact pads are connected to mechanical contactors including pogo-pins when the contact structure is assembled;
   a plurality of contactors mounted on the probe card at about a center of the probe card in a manner that tips of the contactors are projected from one surface of the probe card to contact; and
   a flexible cable having a plurality of signal patterns for transmitting electrical signals therethrough, the flexible cable having the contactors at one end while being connected to the sockets on the probe card at another end; and
   wherein the flexible cable having the contactors are provided on one surface of the probe card and the tips of the contactors are inserted in the probe card and projected from another surface of the probe card, thereby obviating a substrate having signal patterns for space transforming.

2. A contact structure for establishing electrical connection with contact targets as defined in claim 1, wherein the contactors are integrally formed at the end of the flexible cable using conductor of the signal patterns on the flexible cable.

3. A contact structure for establishing electrical connection with contact targets as defined in claim 1, wherein the contactors are produced separately from the flexible cable and attached to the corresponding signal patterns on the flexible cable.

4. A contact structure for establishing electrical connection with contact targets as defined in claim 1, wherein the tip of the contactor is sharpened to improve the contact performance.

5. A contact structure for establishing electrical connection with contact targets as defined in claim 1, wherein the flexible cable having the contactors is clamped by an alignment frame and attached to the probe card after inserting the contactors in the probe card.

6. A contact structure for establishing electrical connection with contact targets, comprising:
   a probe card having a plurality of sockets and a plurality of contact pads and signal patterns for connecting the sockets and the contact pads where said contact pads are connected to mechanical contactors including pogo-pins when the contact structure is assembled;
   a support substrate provided in parallel with the probe card for mounting contactors for connecting the contactors with the contact targets;
   a plurality of contactors mounted on the support substrate in a manner that tips of the contactors are projected from one surface of the support substrate to contact with the contact targets; and
   a flexible cable having a plurality of signal patterns for transmitting electrical signals therethrough, the flexible cable having the contactors at one end while being connected to the sockets on the probe card at another end;
   wherein the flexible cable having the contactors is provided between the support substrate and the probe card and the one end of the flexible cable is connected to the probe card through the socket, and the tips of the contactors are inserted in the support substrate and are projected from a surface of the support substrate at a side opposite to the probe card, and wherein the support substrate has no signal patterns for space transforming.

7. A contact structure for establishing electrical connection with contact targets as defined in claim 6, wherein the contactors are integrally formed at the end of the flexible cable using conductor of the signal patterns on the flexible cable.

8. A contact structure for establishing electrical connection with contact targets as defined in claim 6, wherein the contactors are produced separately from the flexible cable and attached to the corresponding signal patterns on the flexible cable.

9. A contact structure for establishing electrical connection with contact targets as defined in claim 6, wherein the tip of the contactor is sharpened to achieve a scrubbing effect.

10. A probe contact assembly for interfacing between semiconductor device under test and a semiconductor test system, comprising:
    a probe card having a plurality of sockets and a plurality of contact pads and signal patterns for connecting the sockets and contact pads where said contact pads are connected to mechanical contactors including pogo-pins when the contact structure is assembled;
    a plurality of contactors mounted on the probe card at about a center of the probe card in a manner that tips of the contactors are projected from one surface of the probe card to contact with the semiconductor device under test;
    a flexible cable having a plurality of signal patterns for transmitting electrical signals therethrough, the flexible cable having the contactors at one end while being connected to the sockets on the probe card at another end; and
    a plurality of flexible contact pins for connecting the contact pads on the probe card with the semiconductor test system thereby sending test signals to the semiconductor device under tests;
    wherein the flexible cable having the contactors are provided on one surface of the probe card and the tips of the contactors are inserted in the probe card and projected from another surface of the probe card, thereby obviating a substrate having signal patterns for space transforming.

11. A probe contact assembly as defined in claim 10, wherein the contactors are integrally formed at the end of the flexible cable using conductor of the signal patterns on the flexible cable.

12. A probe contact assembly as defined in claim 10, wherein the contactors are produced separately from the flexible cable and attached to the corresponding signal patterns on the flexible cable.

13. A probe contact assembly as defined in claim 10, wherein the tip of the contactor is sharpened to achieve a scrubbing effect.

14. A probe contact assembly for interfacing between semiconductor device under test and a semiconductor test system, comprising:
- a probe card having a plurality of sockets and a plurality of contact pads and signal patterns for connecting the sockets and the contact pads where said contact pads are connected to mechanical contactors including pogo-pins when the contact structure is assembled;
- a support substrate provided in parallel with the probe card for mounting contactors for connecting the contactors with the semiconductor device under test;
- a plurality of contactors mounted on the support substrate in a manner that tips of the contactors are projected from one surface of the support substrate to contact with the semiconductor device under test;
- a flexible cable having a plurality of signal patterns for transmitting electrical signals therethrough, the flexible cable having the contactors at one end while being connected to the sockets on the probe card at another end; and
- a plurality of flexible contact pins for connecting the contact pads on the probe card with the semiconductor test system thereby sending test signals to the semiconductor device under test;
- wherein the flexible cable having the contactors is provided between the support substrate and the probe card and the one end of the flexible cable is connected to the probe card through the socket, and the tips of the contactors are inserted in the support substrate and are projected from a surface of the support substrate at a side opposite to the probe card, and wherein the support substrate has no signal patterns for space transforming.

* * * * *